United States Patent
Shimizu

(10) Patent No.: US 7,586,379 B2
(45) Date of Patent: Sep. 8, 2009

(54) VOLTAGE CONTROLLED OSCILLATOR WITH OPERATION CURRENT ADJUSTING DEVICE

(75) Inventor: Yutaka Shimizu, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 154 days.

(21) Appl. No.: 11/684,701

(22) Filed: Mar. 12, 2007

(65) Prior Publication Data

US 2007/0222525 A1     Sep. 27, 2007

(30) Foreign Application Priority Data

Mar. 13, 2006  (JP) .............................. 2006-067545

(51) Int. Cl.
    *H03L 7/00*      (2006.01)
(52) U.S. Cl. .............................. 331/16; 331/17; 331/34; 331/117 R; 331/117 FE; 331/167; 331/177 R; 331/185
(58) Field of Classification Search ................... 331/16, 331/17, 117, 34, 117 R, 117 FE, 167, 177 R, 331/185; 327/156–159
    See application file for complete search history.

(56) References Cited

U.S. PATENT DOCUMENTS

| | | | | |
|---|---|---|---|---|
| 4,456,890 A * | 6/1984 | Carickhoff | ................... | 331/1 A |
| 5,128,632 A * | 7/1992 | Erhart et al. | ................. | 331/1 A |
| 5,175,884 A * | 12/1992 | Suarez | ........................ | 455/260 |
| 5,757,238 A * | 5/1998 | Ferraiolo et al. | .............. | 331/16 |
| 6,411,171 B2 * | 6/2002 | Itoh | ........................ | 331/117 R |
| 6,650,195 B1 * | 11/2003 | Brunn et al. | ............ | 331/177 V |
| 6,653,908 B1 * | 11/2003 | Jones | .......................... | 331/183 |
| 6,680,655 B2 * | 1/2004 | Rogers | ........................ | 331/109 |
| 6,838,951 B1 * | 1/2005 | Nieri et al. | ............... | 331/177 V |
| 6,909,336 B1 * | 6/2005 | Rajagopalan et al. | ........ | 331/183 |
| 7,061,337 B2 * | 6/2006 | Partovi et al. | ................ | 331/109 |
| 7,289,003 B2 * | 10/2007 | Blum | .......................... | 331/183 |
| 7,369,009 B2 * | 5/2008 | Hofer | .......................... | 331/183 |
| 2003/0174024 A1 * | 9/2003 | Sandner | ..................... | 331/36 C |
| 2004/0169564 A1 * | 9/2004 | Muramatsu | .............. | 331/177 V |
| 2004/0183576 A1 * | 9/2004 | Kiyose et al. | ................ | 327/157 |
| 2005/0237119 A1 * | 10/2005 | Irie | .............................. | 331/16 |
| 2006/0017519 A1 * | 1/2006 | Pernia et al. | ................. | 331/185 |
| 2006/0033591 A1 * | 2/2006 | Kim et al. | ..................... | 331/185 |
| 2006/0152295 A1 * | 7/2006 | Miyashita et al. | ............ | 331/185 |

FOREIGN PATENT DOCUMENTS

JP        2001-313527        11/2001

* cited by examiner

*Primary Examiner*—Arnold Kinkead
*Assistant Examiner*—Richard Tan
(74) *Attorney, Agent, or Firm*—Oblon, Spivak, McClelland, Maier & Neustadt, P.C.

(57) ABSTRACT

A voltage controlled oscillator has an amplifier circuit which includes an inductor and a variable capacitance element, and outputs an oscillation signal of an oscillation frequency corresponding to an oscillation frequency control voltage supplied to the variable capacitance element; and a power supply circuit which supplies an operation current to the amplifier circuit, wherein by changing the operation current outputted from the power supply circuit in a state where the oscillation frequency control voltage is fixed to a desired value, a value of the operation current at which the oscillation frequency of the oscillation signal takes a value in the vicinity of a maximum value, is extracted, and the extracted value of the operation current is set as a value of the operation current outputted from the power supply circuit.

14 Claims, 12 Drawing Sheets

VOLTAGE CONTROLLED OSCILLATOR WITH OPERATION CURRENT ADJUSTING DEVICE

CROSS-REFERENCE TO RELATED APPLICATION

This application is based upon and claims the benefit of priority from the prior Japanese Patent Application No. 2006-67545, filed on Mar. 13, 2006, the entire contents of which are incorporated herein by reference.

BACKGROUND OF THE INVENTION

1. Field of the Invention

The present invention relates to a voltage controlled oscillator which outputs an oscillation signal of a desired oscillation frequency, an operation current adjusting device which controls the voltage controlled oscillator, and an operation current adjusting method of the voltage controlled oscillator.

2. Background Art

Conventionally, for example, in a mobile communication terminal whose market has been rapidly expanding, a voltage controlled oscillator (VCO) needs to be provided for each terminal.

As characteristics of the voltage controlled oscillator, the phase noise characteristic which is a parameter indicating a degree of oscillation purity is very important along with the oscillation frequency and the frequency variable range.

In the case of a common voltage controlled oscillator, a change in the phase noise characteristic with respect to the oscillation frequency is large. This is because loss in a resonator is different for each oscillation frequency. Further, the phase noise characteristic is also different depending upon manufacturing conditions. This is considered due to the fact that loss in a resonator varies depending upon manufacturing conditions, and that characteristics of an amplifier circuit and a power supply circuit of the voltage controlled oscillator also vary depending upon manufacturing conditions, or the like.

Here, as the above described voltage controlled oscillator, there is for example an oscillator provided with an amplifier circuit which includes an inductor and a variable capacitance element and outputs an oscillation signal of an oscillation frequency corresponding to an oscillation frequency control voltage supplied to the variable capacitance element, and with a power supply circuit which supplies an operation current to the amplifier circuit.

In this voltage controlled oscillator, the change in the phase noise characteristic with respect to the oscillation frequency is mitigated by controlling the power supply circuit simultaneously with the oscillation frequency control voltage. That is, the voltage controlled oscillator is designed to be compensated in such a manner that the change in the phase noise characteristic is mitigated by directly measuring the loss property of the resonator and the phase noise characteristic in advance (see, for example, Japanese Patent Laid-Open Publication No. 2001-313527).

However, in the above described conventional voltage controlled oscillator, there is a case where the loss property of the resonator is made different by variations in manufacturing each voltage controlled oscillator, or by use conditions such as ambient temperature and the like. In this case, there is a problem that the phase noise characteristic is eventually deteriorated, even when a desired compensation design is performed on the basis of the loss property of the resonator and the phase noise characteristic which were measured in advance.

In addition, a predetermined external device is required for measuring the above described phase noise characteristic. Therefore, there is for example a problem that it is difficult to automatically adjust the phase noise characteristic by a circuit configuration in a semiconductor integrated circuit including the voltage controlled oscillator.

SUMMARY OF THE INVENTION

According one aspect of the present invention, there is provided: a voltage controlled oscillator comprising an amplifier circuit which includes an inductor and a variable capacitance element, and outputs an oscillation signal of an oscillation frequency corresponding to an oscillation frequency control voltage supplied to the variable capacitance element; and a power supply circuit which supplies an operation current to the amplifier circuit, wherein by changing the operation current outputted from the power supply circuit in a state where the oscillation frequency control voltage is fixed to a desired value, a value of the operation current at which the oscillation frequency of the oscillation signal takes a value in the vicinity of a maximum value, is extracted, and the extracted value of the operation current is set as a value of the operation current outputted from the power supply circuit.

According another aspect of the present invention, there is provided: an operation current adjusting device comprising a voltage controlled oscillator which has an amplifier circuit including an inductor and a variable capacitance element, and outputting an oscillation signal of a frequency corresponding to an oscillation frequency control voltage supplied to the variable capacitance element, and has a power supply circuit supplying an operation current to the amplifier circuit; a voltage generating section which outputs the oscillation frequency control voltage; a frequency detecting section which measures the oscillation frequency of the oscillation signal; and a control section which outputs a voltage setting signal for the voltage generating section to control the oscillation frequency control voltage, and outputs an operation current control signal for the power supply circuit to control the operation current on the basis of the oscillation frequency measured by the frequency detecting section, wherein the control section outputs the voltage setting signal to the voltage generating section to fix the oscillation frequency control voltage to a desired value, changes the operation current outputted from the power supply circuit by the operation current control signal, extracts a value of the operation current at which the oscillation frequency of the oscillation signal measured by the frequency detecting section takes a value in the vicinity of a maximum value, and outputs the operation current control signal to set the operation current outputted from the power supply circuit to the extracted value of the operation current.

According still further aspect of the present invention, there is provided: an operation current adjusting device comprising a PLL circuit provided with a voltage controlled oscillator which includes an amplifier circuit having an inductor and a variable capacitance element, and outputting an oscillation signal of a frequency corresponding to an oscillation frequency control voltage supplied to the variable capacitance element, and includes a power supply circuit supplying an operation current to the amplifier circuit, with an N frequency divider which outputs a signal formed by dividing the oscillation signal to 1/N, with a phase comparator which compares an oscillation frequency of the output signal of the N frequency divider with a reference frequency and generates a phase difference signal, and with a loop filter which outputs the oscillation frequency control voltage on the basis of the phase difference signal outputted by the phase comparator; a voltage measuring section which measures the oscillation frequency control voltage; and a control section which outputs an N division setting signal for controlling the N frequency divider, and outputs an operation current control signal for the power supply circuit to control the operation current on the basis of the oscillation frequency control voltage measured by the voltage measuring section, wherein the control section outputs the N division setting signal to the N frequency divider to fix the oscillation frequency to a desired value, and changes the operation current outputted from the power supply circuit by the operation current control signal, whereby the control section extracts a value of the operation current at which a value of the oscillation frequency control voltage measured by the voltage measuring section becomes a value in the vicinity of a minimum value in the case of the voltage controlled oscillator whose oscillation frequency-oscillation frequency control voltage characteristic has a positive inclination, or extracts a value of the operation current at which a value of the oscillation frequency control voltage measured by the voltage measuring section becomes a value in the vicinity of a maximum value in the case of the voltage controlled oscillator whose oscillation frequency-oscillation frequency control voltage characteristic has a negative inclination, and outputs the operation current control signal to set the operation current outputted from the power supply circuit to the extracted value of the operation current.

According further aspect of the present invention, there is provided: an operation current adjusting method of a voltage controlled oscillator having an amplifier circuit which includes an inductor and a variable capacitance element and outputs an oscillation signal of an oscillation frequency corresponding to an oscillation frequency control voltage supplied to the variable capacitance element, and having a power supply circuit which supplies an operation current to the amplifier circuit, comprising changing the operation current outputted from the power supply circuit in a state where the oscillation frequency control voltage is fixed to a desired value; extracting a value of the operation current at which the oscillation frequency of the oscillation signal takes a value in the vicinity of a maximum value; and setting the value of the operation current outputted from the amplifier circuit to the extracted value of the operation current.

DETAILED DESCRIPTION

The operation current adjusting device according to the present invention is capable of automatically adjusting an operation current prior to ordinary use, in order for example to stabilize the phase noise of the voltage controlled oscillator low. In this automatic adjustment, instead of directly measuring the phase noise which is difficult to be measured, a method for measuring the frequency change in the oscillation signal or the change in the oscillation frequency control voltage is used.

In the following, examples according to the present invention will be described with reference to the accompanying drawings.

EMBODIMENT 1

Figure 1:
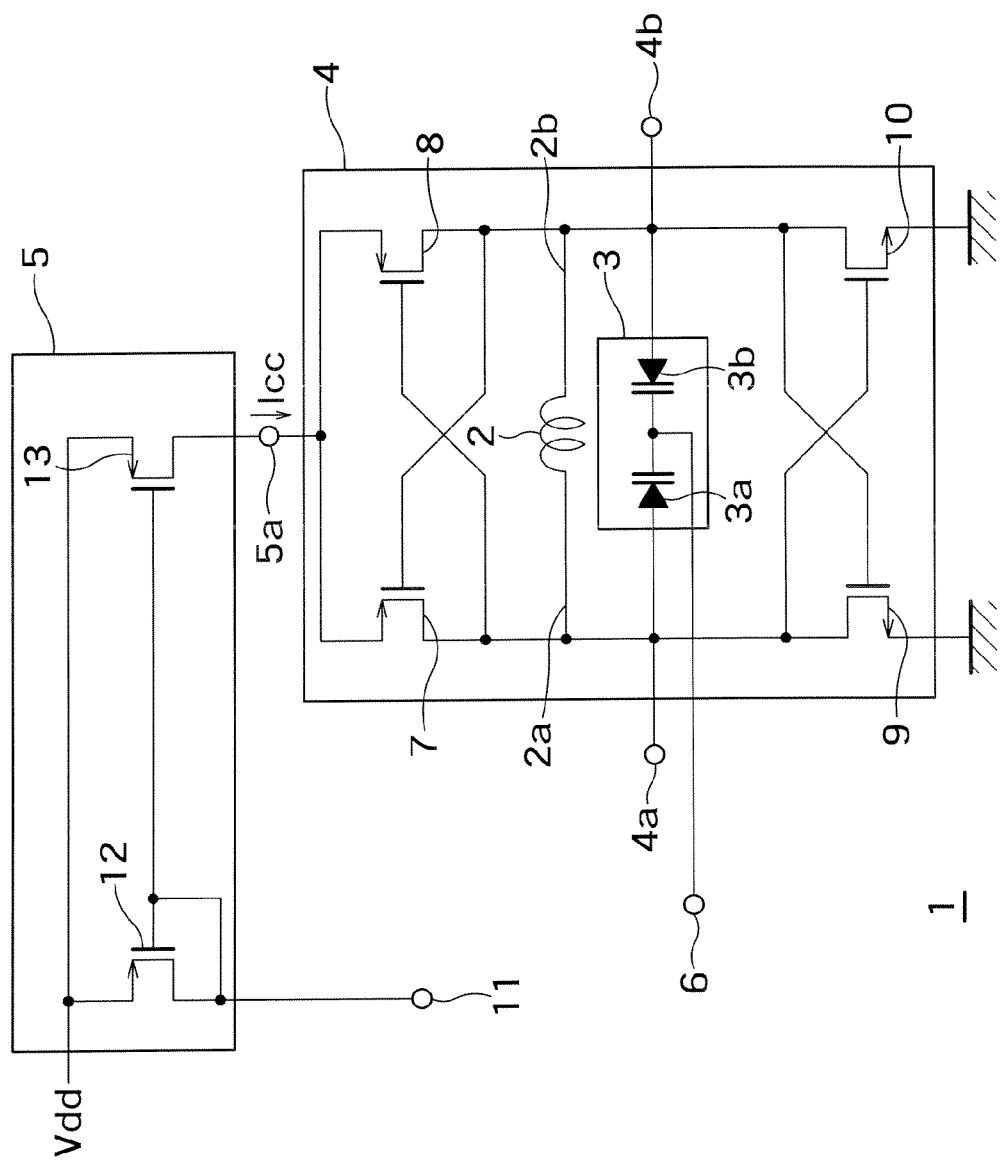
FIG. 1 is a circuit diagram showing a circuit configuration of a voltage controlled oscillator according to Embodiment 1 of the present invention.

FIG. 1 is a circuit diagram showing a circuit configuration of a voltage controlled oscillator according to Embodiment 1 of the present invention.

As shown in FIG. 1, the voltage controlled oscillator 1 is provided with an amplifier circuit 4 which includes an inductor 2 and a variable capacitance element 3, and outputs an oscillation signal of an oscillation frequency corresponding to an oscillation frequency control voltage Vcont supplied to the variable capacitance element 3, and with a power supply circuit 5 which supplies an operation current Icc to the amplifier circuit 4.

The inductor 2 constitutes a resonator together with the variable capacitance element 3.

The variable capacitance element 3 includes, for example, a variable capacitance diode 3a and a variable capacitance diode 3b. The anode of the variable capacitance diode 3a is connected to one end 2a of the inductor 2, and the cathode of the variable capacitance diode 3a is connected to the cathode of variable capacitance diode 3b. The anode of the variable capacitance diode 3b is connected to the other terminal 2b of the inductor 2. The above described oscillation frequency control voltage Vcont inputted from an oscillation frequency control voltage terminal 6 is supplied to the commonly connected cathodes of the variable capacitance diodes 3a and 3b.

Here, the amplifier circuit 4 includes the inductor 2, the variable capacitance element 3, as described above, and a first p-type MOS transistor 7 whose source is connected to an output terminal 5a of the power supply circuit 5, whose drain is connected to the one terminal 2a of the inductor 2, and whose gate is connected to the other terminal 2b of the inductor 2, and a second p-type MOS transistor 8 whose source is connected to the source of the first p-type MOS transistor 7, whose gate is connected to the drain of the first p-type MOS transistor 7, and whose drain is connected to the gate of the first p-type MOS transistor 7.

Furthermore, the amplifier circuit 4 includes a first n-type MOS transistor 9 whose source is connected to the ground potential, whose drain is connected to the one terminal 2a of the inductor 2, and whose gate is connected to the other terminal 2b of the inductor 2, and a second n-type MOS transistor 10 whose source is connected to the source of the first n-type MOS transistor 9, whose gate is connected to the drain of the first n-type MOS transistor 9, and whose drain is connected to the gate of the first n-type MOS transistor 9.

The amplifier circuit 4 outputs an oscillation signal Sosc from output terminals 4a and 4b on the basis of inputs of the oscillation frequency control voltage Vcont and the operation current Icc.

The power supply circuit 5 includes a third p-type MOS transistor 12 whose source is connected to a power supply potential Vdd, whose drain is connected to an operation current control terminal 11, and whose gate is connected to the drain thereof, and a fourth p-type MOS transistor 13 whose source is connected to the source of the third p-type MOS transistor 12, whose drain is connected to the output terminal 5a of the power supply circuit 5, and whose gate is connected to the gate of the third p-type MOS transistor 12.

These third and fourth p-type MOS transistors 12 and 13 constitute a current mirror circuit, and outputs a current equal to a current inputted into the operation current control terminal 11, as the operation current Icc from the output terminal 5a.

Here, a relation between the oscillation frequency of the voltage controlled oscillator having the above described configuration and the oscillation frequency control voltage is explained.

Figure 2:
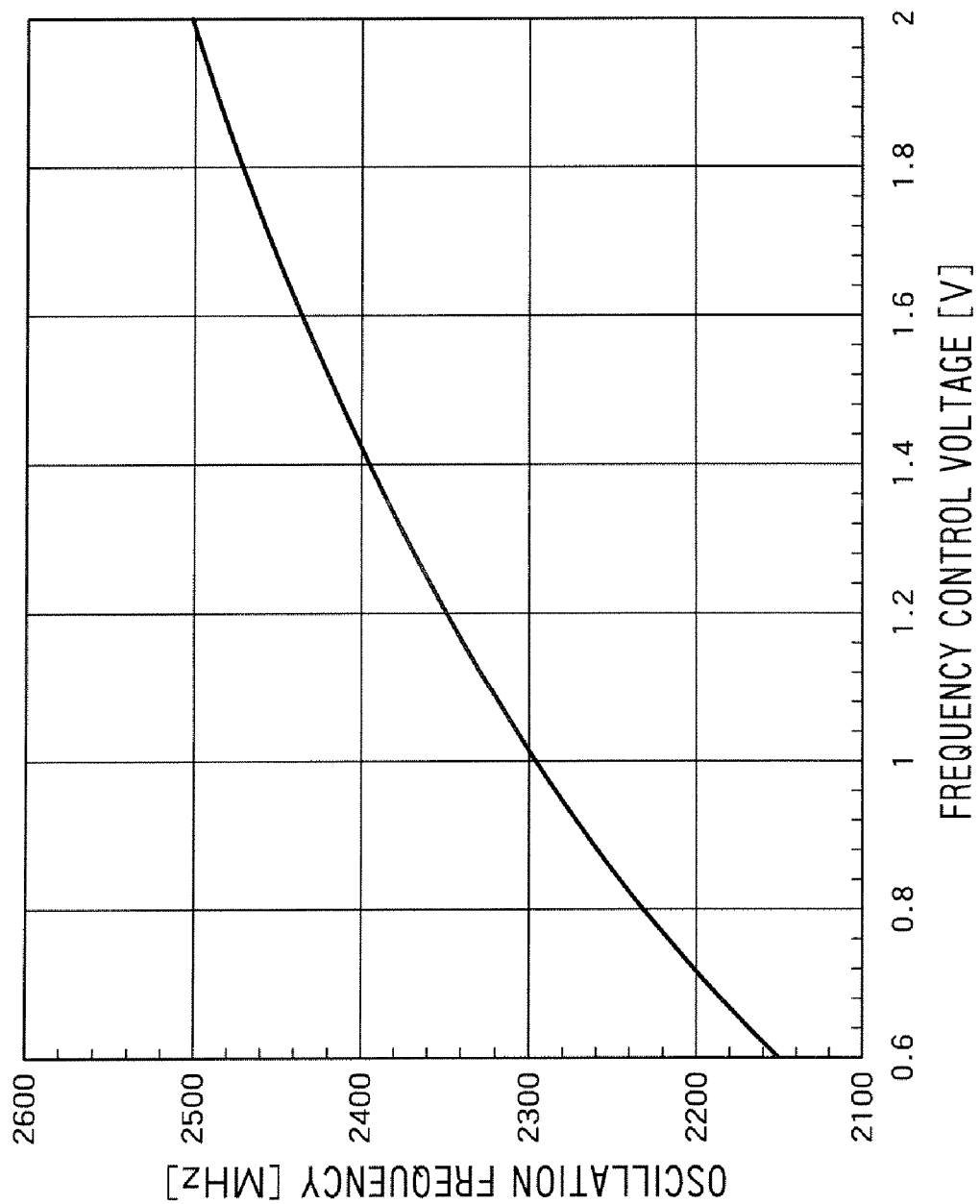
FIG. 2 is a graph showing a frequency control characteristic of the voltage controlled oscillator in the state where the operation current of the amplifier circuit is fixed.

FIG. 2 is a graph showing a frequency control characteristic of the voltage controlled oscillator in the state where the operation current of the amplifier circuit is fixed.

As shown in FIG. 2, the oscillation frequency is increased as the oscillation frequency control voltage is increased, and hence, in the state where the operation current of the amplifier circuit is fixed, the oscillation frequency is a monotonously increasing function of the oscillation frequency control voltage within the measured range. Thus, in the state where the operation current of the amplifier circuit is fixed, the oscillation frequency control voltage and the oscillation frequency correspond to each other one to one.

In this way, the voltage controlled oscillator 1 in FIG. 1 has a positive inclination in the oscillation frequency-oscillation frequency control voltage characteristic.

It should be noted that in the case where varicap diodes having a reverse capacitance-applied voltage characteristic is used as the variable capacitance diodes (pn junction type varicap diodes) 3a and 3b shown in FIG. 1, or in the case where the direction of the junction of the variable capacitance diodes (pn junction type varicap diodes) 3a and 3b is reversed, the voltage controlled oscillator 1 in FIG. 1 has a negative inclination in the oscillation frequency-oscillation frequency control voltage characteristic. That is, the oscillation frequency is decreased as the oscillation frequency control voltage is increased, and hence, in the state where the operation current of the amplifier circuit is fixed, the oscillation frequency is a monotonously decreasing function of the oscillation frequency control voltage within the measured range.

Thus, in order to decrease a frequency which is once increased, in the case where the voltage controlled oscillator 1 has a positive inclination in the oscillation frequency-oscillation frequency control voltage characteristic (FIG. 2), the control voltage need to be decreased, but in the case where the voltage controlled oscillator 1 has a negative inclination in the oscillation frequency-oscillation frequency control voltage characteristic, the control voltage need to be increased.

Next, a relation between the operation current of the voltage controlled oscillator provided, as described above, with an amplifier circuit which includes an inductor and a variable capacitance element and outputs an oscillation signal of an oscillation frequency corresponding to an oscillation frequency control voltage supplied to the variable capacitance element, and with a power supply circuit which supplies an operation current to the amplifier circuit, and the phase noise, and a relation between the operation current and the oscillation frequency are explained.

Figure 3:
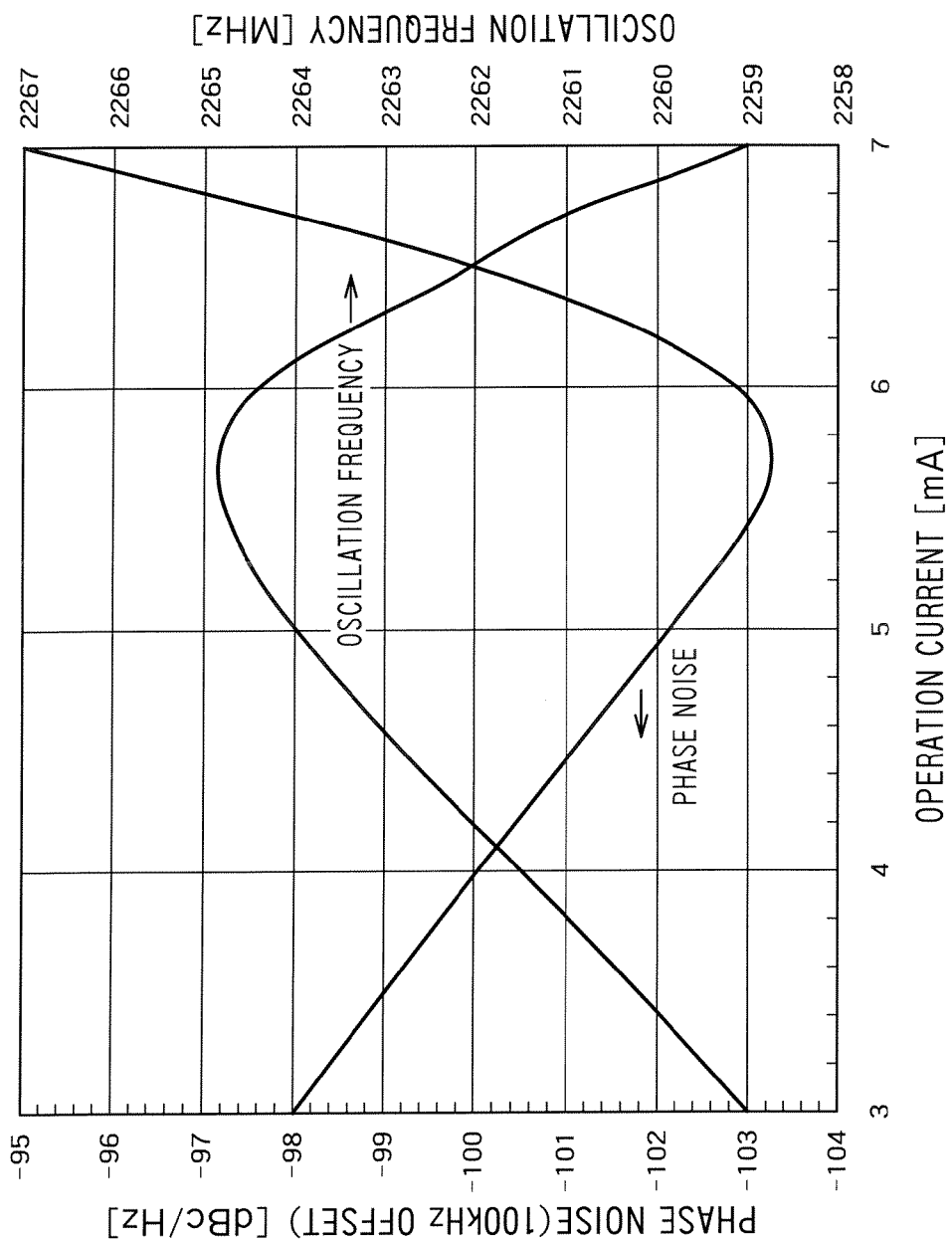
FIG. 3 is a graph showing a relation between the operation current of the voltage controlled oscillator and the phase noise, and a relation between the operation current and the oscillation frequency.

FIG. 3 is a graph showing a relation between the operation current of the voltage controlled oscillator and the phase noise, and a relation between the operation current and the oscillation frequency.

Here, conventionally, the voltage controlled oscillator changes the resonance frequency of the resonator by using the control voltage as an input, so as to change the oscillation frequency. However, in the sate where the control voltage is fixed, when a current supplied to the amplifier circuit in the voltage controlled oscillator is changed, the oscillation frequency is slightly changed. At this time, when the phase noise characteristic is observed simultaneously with the oscillation frequency, it is seen that there is a relation between the phase noise and the oscillation frequency in which the phase noise is minimized at a current value allowing the oscillation frequency to become maximum. That is, the phase noise characteristic is optimized at the current value at which the oscillation frequency becomes maximum.

As shown in FIG. 3, when a value of operation current is about 5.7 mA, the phase noise is reduced to a minimum value of about=103 dBc/Hz. Therefore, the phase noise characteristic is optimized at this value of the operation current.

Figure 4:
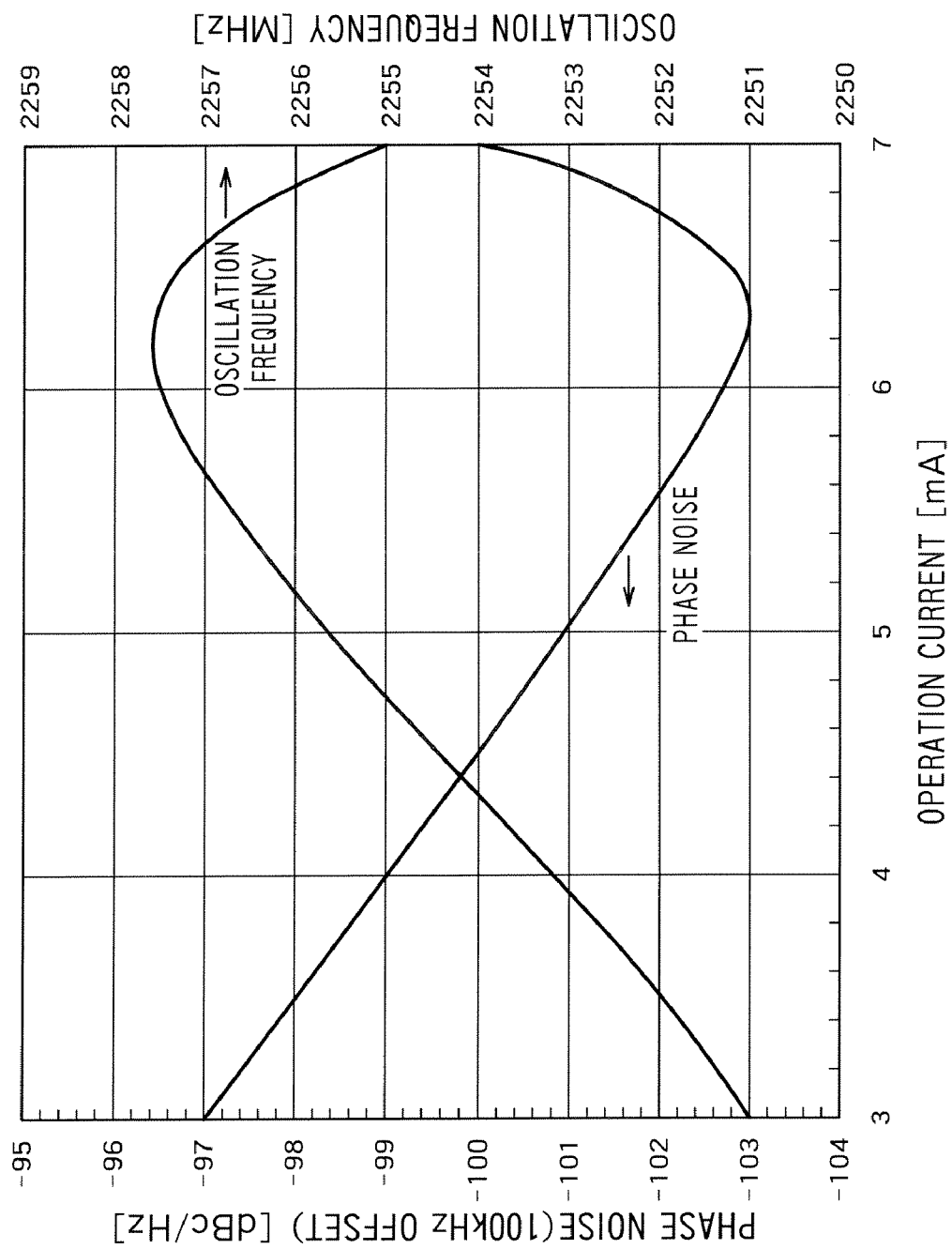
FIG. 4 is a graph showing a relation between the operation current of a voltage controlled oscillator manufactured under conditions different from those in FIG. 3 and the phase noise, and a relation between the operation current and the oscillation frequency.

FIG. 4 is a graph showing a relation between the operation current of a voltage controlled oscillator manufactured under conditions different from those in FIG. 3 and the phase noise, and a relation between the operation current and the oscillation frequency.

As shown in FIG. 4, the tendency of the phase noise characteristic and the oscillation frequency characteristic is the same as that shown in FIG. 3. The optimum current value in this case is about 6.3 mA which is different from the value in the case shown in FIG. 3.

In this way, the current value at which the phase noise characteristic is optimized is different depending upon the manufacturing conditions and the control voltage, but the tendency of the change that the phase noise is minimized at the current value maximizing the oscillation frequency is maintained.

Here, a large external device is required to measure the phase noise characteristic, which makes it difficult to effect the measurement in an integrated circuit. However, the measurement of the oscillation frequency can be relatively easily performed in the integrated circuit.

Thus, in the present example, instead of directly measuring the phase noise, the relation between the operation current of the voltage controlled oscillator and the phase noise is utilized, so that the change in the oscillation frequency due to the operation current is observed to thereby enable the phase noise characteristic to be automatically adjusted in the integrated circuit.

Next, a configuration of an operation current adjusting device which adjusts the phase noise characteristic of the oscillation signal by utilizing the above described relation between the operation current of the voltage controlled oscillator and the phase noise, is explained.

Figure 5:
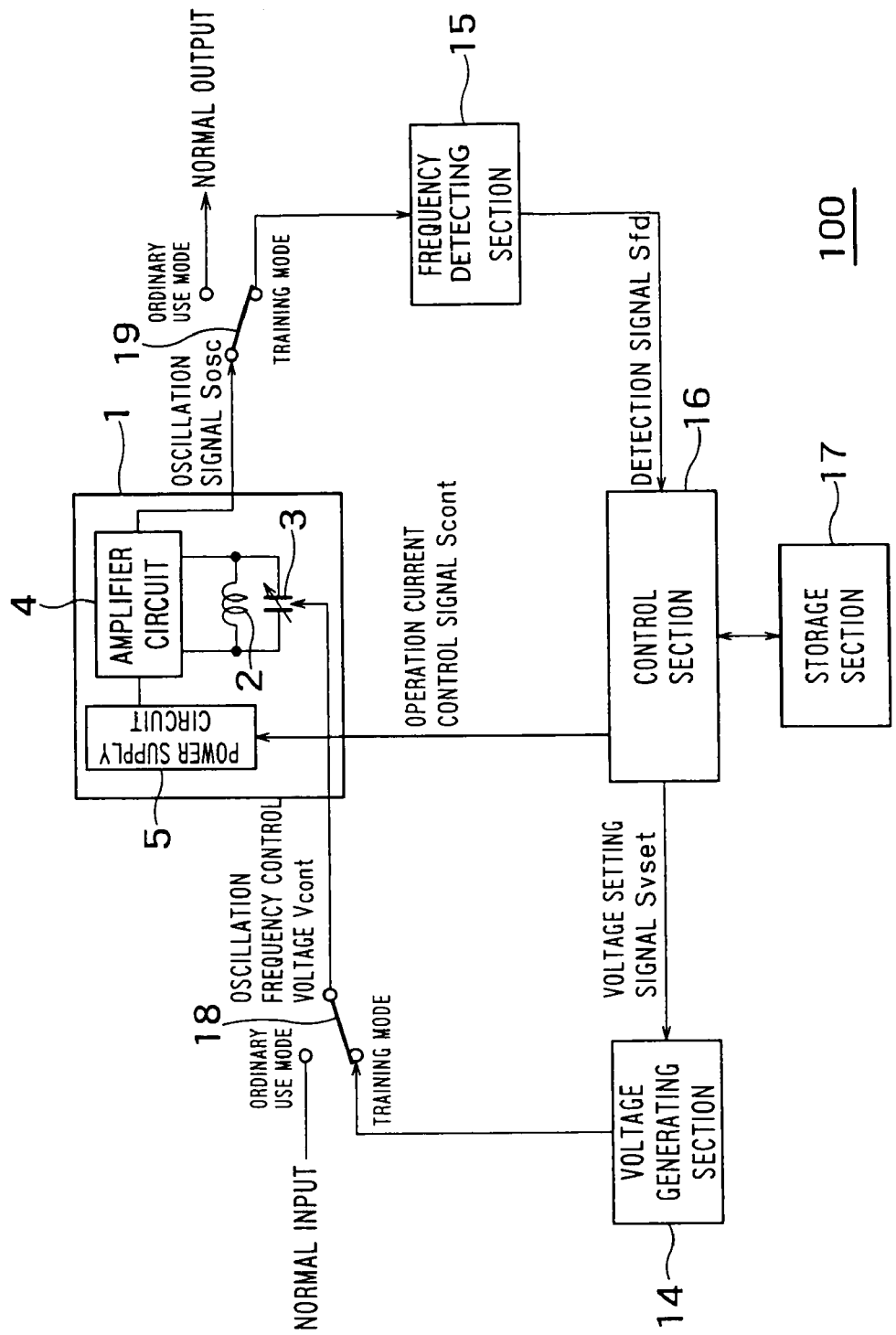
FIG. 5 is a block diagram showing a main part configuration of an operation current adjusting device according to the Embodiment 1 of the present invention.

FIG. 5 is a block diagram showing a main part configuration of an operation current adjusting device according to the Embodiment 1 of the present invention.

As shown in FIG. 5, the operation current adjusting device 100 includes a voltage controlled oscillator 1, a voltage generating section 14 which outputs an oscillation frequency control voltage, a frequency detecting section 15 which measures an oscillation frequency of an oscillation signal, and a control section 16 which outputs a voltage setting signal Svset for the voltage generating section 14 to control the oscillation frequency control voltage Vcont, and outputs an operation current control signal Scont for the power supply circuit 5 to control the operation current Icc on the basis of the oscillation frequency measured by the frequency detecting section 15.

The operation current adjusting device 100 further includes a storage section 17 which stores the operation current Icc extracted by the control section 16.

Furthermore, the operation current adjusting device 100 includes switch circuits 18 and 19 for switching a first mode which is an ordinary use mode and a second mode which is a training mode for performing automatic adjustment.

Here, in the first mode, the switch circuits 18 and 19 are switched so as to make the voltage controlled oscillator 1 connected to a normal input and a normal output which are connected to external circuits, such as a PLL (Phase Locked Loop) circuit. It should be noted that a value determined in the second mode is inputted as the operation current control signal Scont from the control section 16.

On the other hand, in the second mode, the switch circuits 18 and 19 are switched, so that the oscillation frequency control voltage Vcont outputted from the voltage generating section 14 is inputted into the voltage controlled oscillator 1, and the oscillation signal Sosc outputted from the voltage controlled oscillator 1 is inputted into the frequency detecting section 15.

As described above, the voltage generating section 14 generates a voltage determined by the voltage setting signal Svset outputted from the control section 16, and supplies the oscillation frequency control voltage Vcont to the voltage controlled oscillator.

The frequency detecting section 15 receives the oscillation signal Sosc of the voltage controlled oscillator 1, and converts the received oscillation signal into an oscillation frequency, so as to output a detection signal Sfd including oscillation frequency information to the control section 16. The frequency detecting section 15 incorporates, for example, a counter for measuring the oscillation frequency, and the like.

In the second mode, the control section 16 outputs the voltage setting signal Svset to the voltage generating section 14, so as to make the oscillation frequency control voltage Vcont fixed to a desired value. Furthermore, the control section 16 changes the operation current Icc outputted from the power supply circuit 5 by the operation current control signal Scont. Then, the control section 16 extracts a value of operation current Icc at which the oscillation frequency of the oscillation signal Sosc measured by the frequency detecting section 15 takes a value in the vicinity of a maximum value. Then, the control section 16 outputs the operation current control signal Scont so as to make the operation current Icc outputted from the power supply circuit 5 set to the extracted value of the operation current Icc.

It should be noted that, the second mode is preferably performed in a state as close as possible to an actual use state, in order to decrease the difference in the operating condition between the first mode and the second mode.

Furthermore, in order to obtain a desired phase noise characteristic, the operation current Icc is automatically adjusted in the second mode before being used in the first mode.

Next, an operation of the operation current adjusting device 100 having the above described configuration and functions, that is, a method for adjusting the operation current of the voltage controlled oscillator 1, is explained below with reference to flow charts. Here, an operation in the second mode in which the switch circuits 18 and 19 of the operation current adjusting device 100 are switched so as to make the training performed, is explained in particular.

Figure 6:
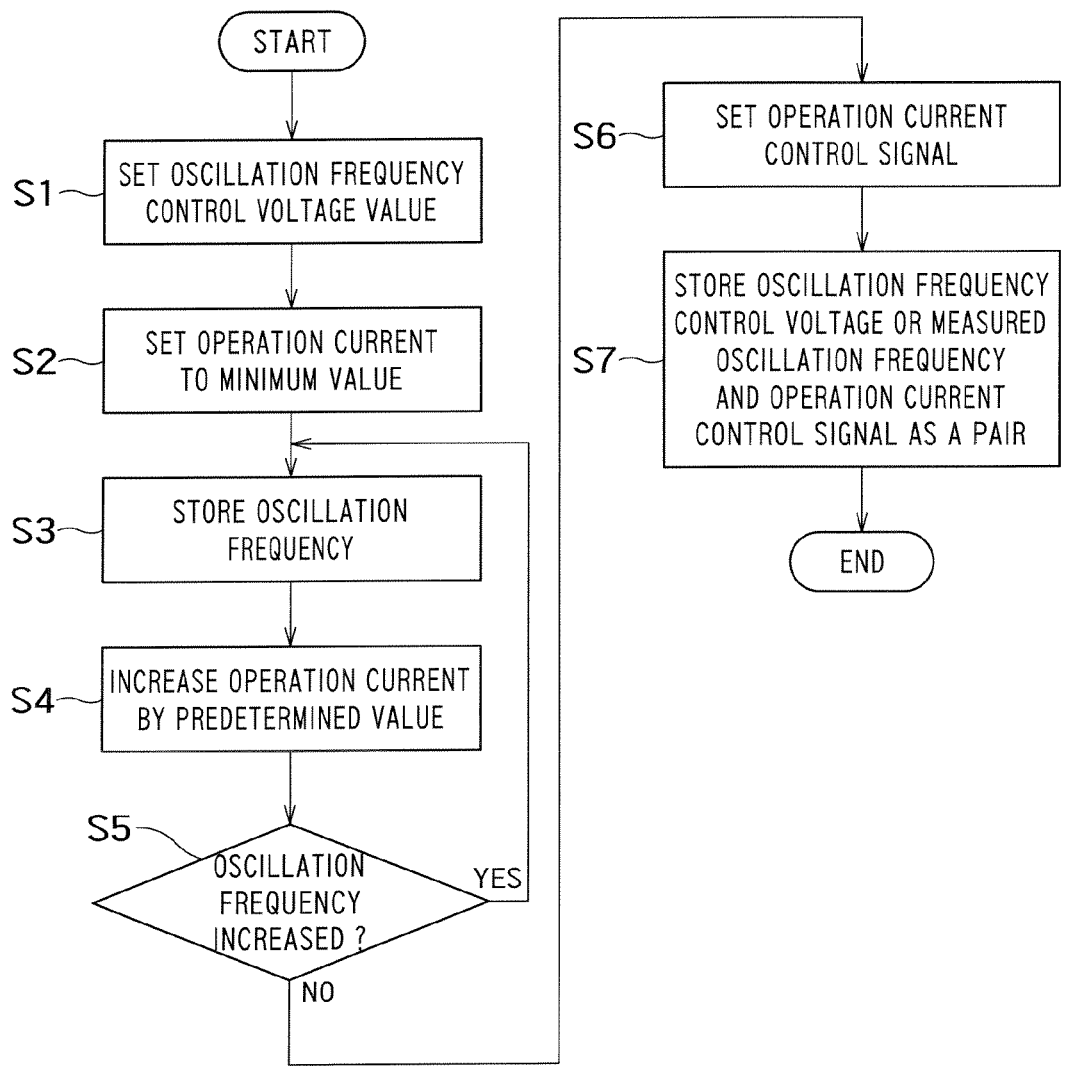
FIG. 6 is a flow chart showing an example of an operation for adjusting the oscillation signal of the voltage controlled oscillator of the operation current adjusting device according to the Embodiment 1 of the present invention.

FIG. 6 is a flow chart showing an example of an operation for adjusting the oscillation signal of the voltage controlled oscillator of the operation current adjusting device according to the Embodiment 1 of the present invention.

As shown in FIG. 6, first, the control section 16 outputs a voltage setting signal Svset to the voltage generating section 14, and sets an oscillation frequency control voltage Vcont (step S1). The oscillation frequency control voltage Vcont is preferably equal to a voltage value actually used in the first mode which is the ordinary use mode.

Next, the control section 16 outputs a desired operation current control signal Scont, and sets the operation current Icc outputted from the power supply circuit 5 to a sufficiently small value (step S2). Here, the operation current Icc may be reduced to a lower limit current at which the oscillation output of the voltage controlled oscillator can be continued.

Next, the control section 16 stores an oscillation frequency detected by the frequency detecting section 15 in the storage section 17 (step S3).

Next, the control section 16 changes the operation current control signal Scont, so as to make the operation current Icc outputted from the power supply circuit 5 increased by a predetermined value (step S4).

Next, the control section 16 compares the oscillation frequency detected by the frequency detecting section 15 at the operation current Icc in step S4 with the oscillation frequency stored in step S3. When the oscillation frequency detected by the frequency detecting section 15 is increased above the oscillation frequency stored in step S3, the control section 16 returns to step S3 and stores the increased oscillation frequency (step S5).

On the other hand, when the oscillation frequency detected by the frequency detecting section 15 is decreased below the oscillation frequency stored in step S3, the control section 16 judges that this oscillation frequency is in the vicinity of the maximum value, and proceeds to the following step.

Through the above described steps S1 to S5, the operation current outputted from the power supply circuit 5 is changed in the state where the oscillation frequency control voltage Vcont is fixed to a desired value.

Here, the operation current Icc in step S4 exceeds the current value at which the oscillation frequency becomes maximum, and hence, an operation current Icc which is decreased by the predetermined value is set as the operation current at which the phase noise characteristic is optimized (step S6). At this time, a stable phase noise characteristic can be normally obtained on the side where the operation current Icc is lower than the current optimum value, and hence, the operation current Icc may be reduced by a value larger than the predetermined value. Furthermore, depending upon the accuracy required of the voltage controlled oscillator 1, the operation current Icc outputted in step S4 may be set as the operation current at which the phase noise characteristic is optimized.

Next, the control section 16 stores the set oscillation frequency control voltage value Vcont or the measured oscillation frequency and the operation current control signal Scont as a pair in the storage section 17 (step S7).

Through the above described steps S6 and S7, a value of operation current at which the oscillation frequency of the oscillation signal takes a value in the vicinity of the maximum value is extracted, and this value of operation current is set as the value of operation current outputted from the amplifier circuit.

Through the above described flow, the operation for adjusting the oscillation signal of the voltage controlled oscillator 1 of the operation current adjusting device 100 is completed.

It should be noted that in the case where a plurality of oscillation frequency control voltages Vcont inputted into the voltage controlled oscillator 1 are set, the control section 16 returns to step S1, so as to again perform the above described flow on the basis of a different oscillation frequency control voltage Vcont. In the first mode which is the normal operation mode, the control section 16 reads a suitable value corresponding to the oscillation frequency control voltage Vcont or the oscillation frequency from the operation current control signal Scont stored in the storage section 17, and outputs the operation current control signal Scont to the voltage controlled oscillator 1.

This makes it possible for the voltage controlled oscillator 1 to output an oscillation signal whose phase noise characteristic is stabilized in the first mode which is the normal operation mode.

Here, in the above described flow chart, the operation current Icc in the vicinity of the maximum value of the oscillation frequency is obtained by increasing the operation current Icc from a small value (minimum value), but the operation current Icc in the vicinity of the maximum value of the oscillation frequency may also be obtained by decreasing the operation current Icc from a large value (maximum value).

Figure 7:
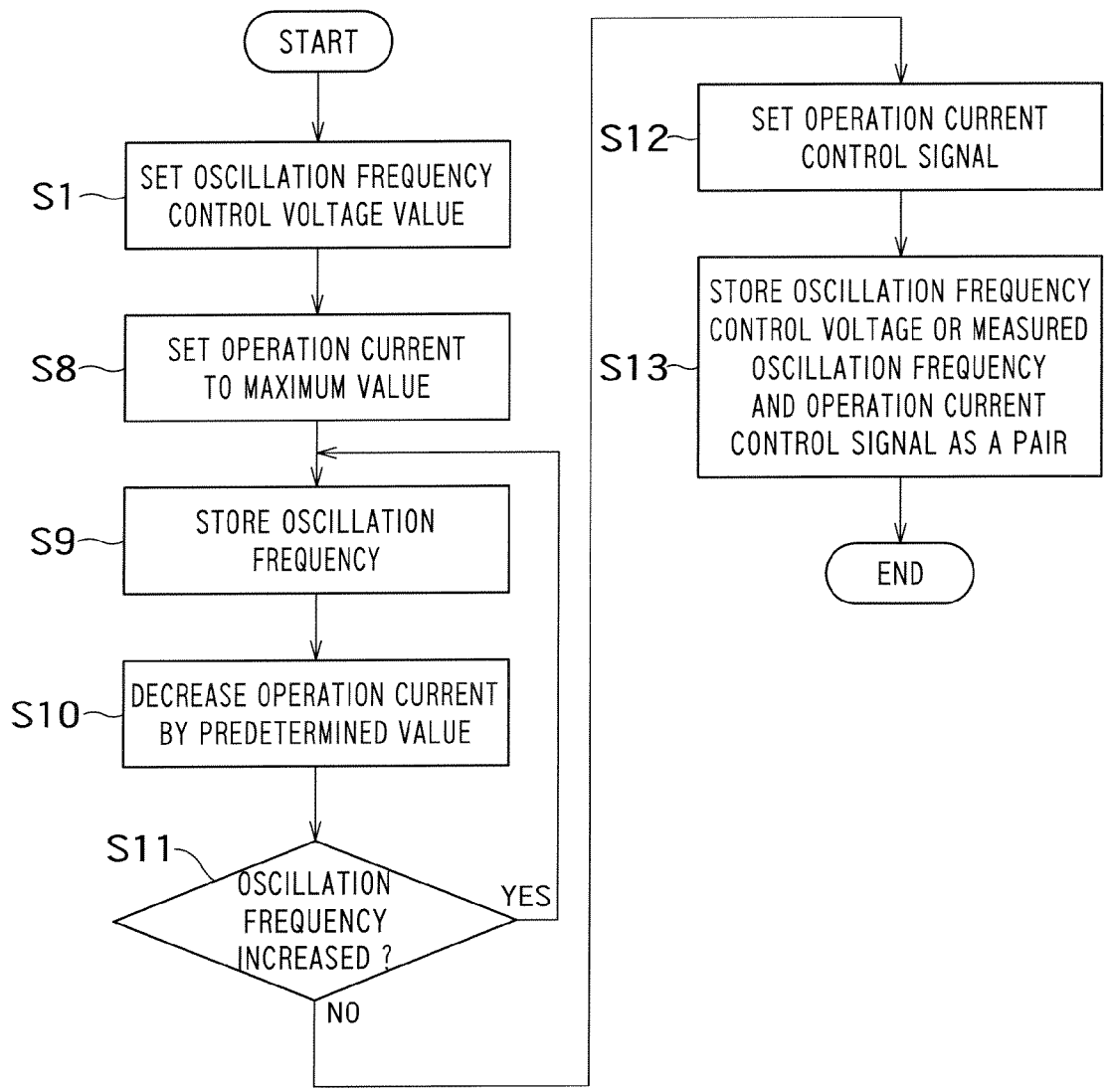
FIG. 7 is a flow chart showing another example of an operation for adjusting the oscillation signal of the voltage controlled oscillator of the operation current adjusting device according to the Embodiment 1 of the present invention.

FIG. 7 is a flow chart showing another example of an operation for adjusting the oscillation signal of the voltage controlled oscillator of the operation current adjusting device according to the Embodiment 1 of the present invention.

First, as shown in FIG. 7, the control section 16 outputs a voltage setting signal Svset to the voltage generating section 14, so as to set an oscillation frequency control voltage Vcont (step S1). The oscillation frequency control voltage Vcont is preferably equal to a voltage value actually used in the first mode which is the ordinary use mode.

Next, the control section 16 outputs a desired operation current control signal Scont, so as to set the operation current Icc outputted from the power supply circuit 5 to a sufficiently large value (maximum value) (step S8). It should be noted that for example, in the case where an approximate value of the operation current Icc at which the oscillation frequency becomes maximum is recognized, the operation current Icc may be set to a value larger than this approximate value by a predetermined value or more.

Next, the control section 16 stores an oscillation frequency detected by the frequency detecting section 15 in the storage section 17 (step S9).

Next, the control section 16 changes the operation current control signal Scont, so as to decrease the operation current Icc outputted from the power supply circuit 5 by the predetermined value (step S10).

Next, the control section 16 compares the oscillation frequency detected by the frequency detecting section 15 at the operation current Icc in step S10, with the oscillation frequency stored in step S9. In the case where the oscillation frequency detected by the frequency detecting section 15 is increased above the oscillation frequency stored in step S9, the control section 16 returns to step S9 and stores this increased oscillation frequency (step 11).

On the other hand, in the case where the oscillation frequency detected by the frequency detecting section 15 in step S11 is decreased below the oscillation frequency stored in step S9, the control section 16 judges that the oscillation frequency is in the vicinity of the maximum value, and proceeds to the following step.

Through the above described steps S1 to S11, the operation current outputted from the power supply circuit 5 is changed in the state where the oscillation frequency control voltage Vcont is fixed to a desired value.

Here, the operation current Icc in step S10 is smaller than the current value at which the oscillation frequency becomes maximum, and hence is increased by the predetermined value, so that the increased operation current Icc is set as the operation current at which the phase noise characteristic is optimized (step S12). At this time, since a stable phase noise characteristic is normally obtained on the side where the operation current Icc is lower than the current optimum value, the operation current Icc outputted in step S11 may be set as the operation current at which the phase noise characteristic is optimized, without being increased by the predetermined value.

Next, the control section 16 stores the set oscillation frequency control voltage value Vcont or the measured oscillation frequency and the operation current control signal Scont as a pair in the storage section 17 (step S13).

Through the above described steps S12 and S13, a value of operation current at which the oscillation frequency of the oscillation signal takes a value in the vicinity of the maximum value is extracted, and this value of operation current is set as the value of operation current outputted from the amplifier circuit.

Through the above described flow, the operation for adjusting the operation current of the voltage controlled oscillator 1 of the operation current adjusting device 100 is completed.

It should be noted that besides the operation current adjusting method of the operation current adjusting device shown in the flow charts in FIG. 6 and FIG. 7, there may be considered a method in which the oscillation frequency characteristic with respect to the sweepable operation current Icc is once measured, and thereafter the operation current Icc at which the oscillation frequency takes a value in the vicinity of the maximum value is obtained by calculation, and the like.

As described above, with the operation current adjusting device according to the present example, the operation current at which the oscillation frequency of the oscillation signal takes a value in the vicinity of the maximum value, is extracted by changing the operation current outputted from the power supply circuit in the state where the oscillation frequency control voltage is fixed to a desired value, and the extracted value of operation current is set as the value of operation current outputted from the amplifier circuit, as a result of which it is possible to automatically adjust the phase noise characteristic of the voltage controlled oscillator.

It should be noted that in the present example, the case where the transistor constituting the amplifier circuit 4 and the power supply circuit 5 is a MOS transistor is explained, but the present example can be similarly applied to the case where the conductivity type of MOS transistor is reversed, by making the polarity of respective circuit configurations reversed.

Furthermore, in the present example, the case where the transistor constituting the amplifier circuit 4 and the power supply circuit 5 is a MOS transistor is explained, but a bipolar transistor can also be used as an alternative in the respective circuit configurations.

EMBODIMENT 2

In the Embodiment 1, for example, a configuration in which the voltage controlled oscillator is not included in external circuits such as a PLL circuit, is explained. However, in the present Embodiment, a configuration in which the voltage controlled oscillator is included in the PLL circuit, is explained.

Figure 8:
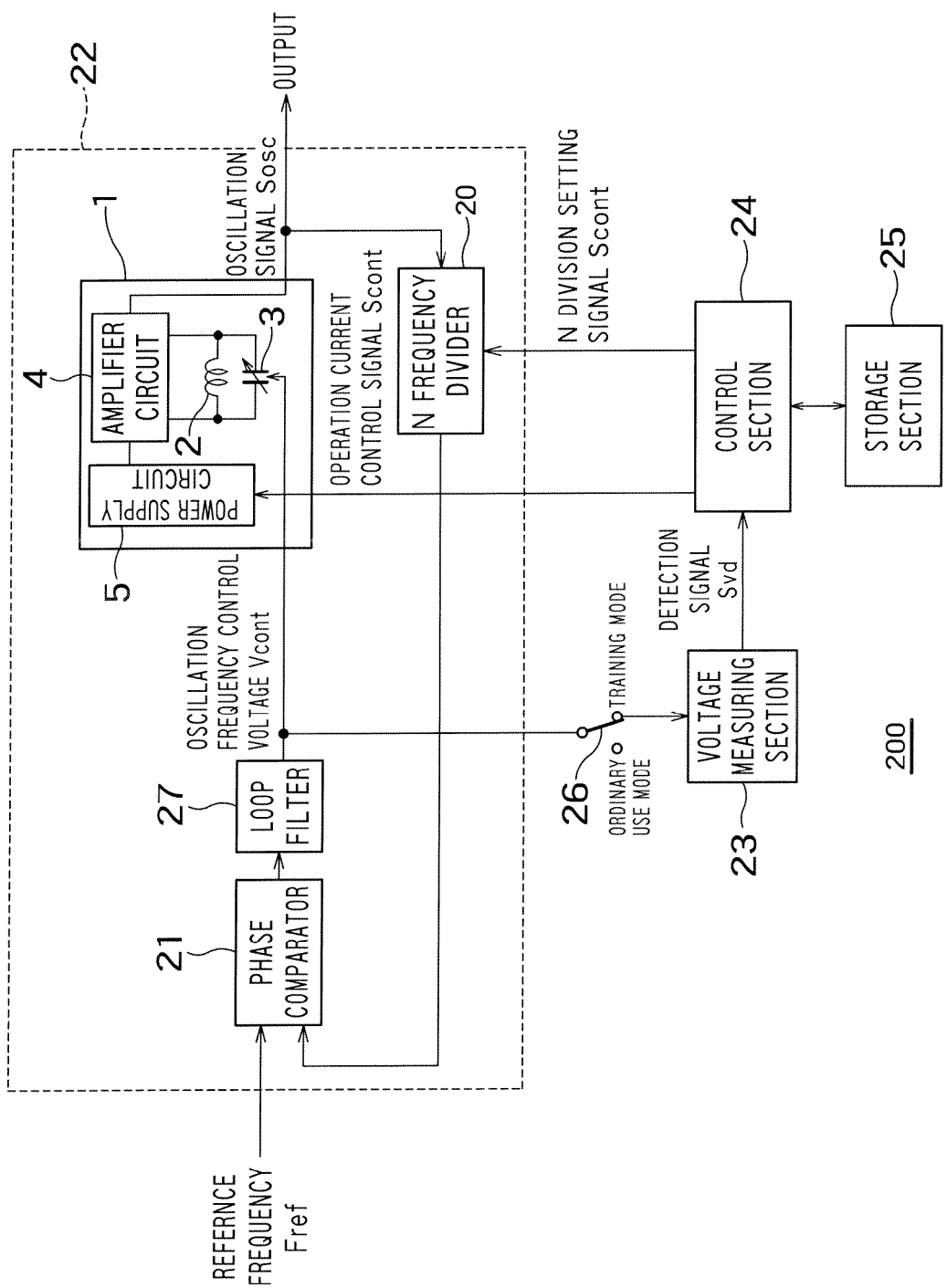
FIG. 8 is a block diagram showing a configuration of a main part of an operation current adjusting device 200 according to Embodiment 2 as an embodiment of the present invention.

FIG. 8 is a block diagram showing a configuration of a main part of an operation current adjusting device 200 according to Embodiment 2 as an embodiment of the present invention. It should be noted that in the figure, the same reference numerals and characters as those in the Embodiment 1 denote the same configurations as those in the Embodiment 1.

As shown in FIG. 8, the operation current adjusting device 200 has a PLL circuit 22 provided with a voltage controlled oscillator 1 which includes an amplifier circuit 4 including an inductor 2 and a variable capacitance element 3 and outputting an oscillation signal Sosc of a frequency corresponding to an oscillation frequency control voltage Vcont supplied to the variable capacitance element 3, and a power supply circuit 5 supplying an operation current Icc to the amplifier circuit 4, with an N frequency divider 20 which divides the oscillation signal Sosc into 1/N and outputs the divided signal, with a phase comparator 21 which compares the oscillation frequency of the output signal of the N frequency divider 20 with a reference frequency Fref to generate a phase difference signal, and with a loop filter 27 which outputs the oscillation frequency control voltage Vcont on the basis of the phase difference signal outputted by the phase comparator 21.

Furthermore, the operation current adjusting device 200 is provided with a voltage measuring section 23 which measures the oscillation frequency control voltage Vcont, and a control section 24 which outputs an operation current control signal Scont for the power supply circuit 5 to control the operation current Icc on the basis of the oscillation frequency control voltage Vcont measured by the voltage measuring section 23.

Furthermore, the operation current adjusting device 200 is provided with a storage section 25 which stores the extracted operation current Icc.

The N frequency divider 20 is controlled by an N division setting signal Sdset inputted from the control section 24, and as described above, divides the oscillation signal Sosc into 1/N, so as to output the divided signal.

The phase comparator 21 performs a phase comparison between the oscillation frequency of the output signal and the reference frequency Fref, so as to generate a phase difference as a pulse-like phase difference signal.

The loop filter 27 removes AC components from the phase difference signal outputted by the phase comparator 21 to generate the oscillation frequency control voltage Vcont, and inputs the generated oscillation frequency control voltage into the voltage controlled oscillator 1.

The control section 24 changes the operation current Icc outputted from the power supply circuit 5 by the operation current control signal Scont, extracts a value of the operation current Icc at which the value of the oscillation frequency control voltage Vcont measured by the voltage measurement part 23 becomes a value in the vicinity of the minimum value, and outputs the operation current control signal Scont such that the operation current Icc outputted from the power supply circuit 5 is set to the extracted value of the operation current Icc.

It should be noted that here, as described above, in the case where the oscillation frequency-oscillation frequency control voltage characteristic of the voltage controlled oscillator in FIG. 1 has a positive inclination (as shown in FIG. 2), a value of the operation current Icc which is in the vicinity of the minimum value is extracted. On the other hand, in the case where the oscillation frequency-oscillation frequency control voltage characteristic of the voltage controlled oscillator has a negative inclination, a value of the operation current Icc which is in the vicinity of the maximum value is extracted. Subsequently, the same operation is performed.

Furthermore, the operation current adjusting device 200 is provided with a switch circuit 26 for switching a first mode which is an ordinary use mode, and a second mode which is a training mode for performing automatic adjustment.

Here, in the first mode, the switch circuit 26 is switched and opened, so as to prevent the oscillation frequency control voltage Vcont from being inputted into the voltage measuring section 23. As described above, the control voltage input of the voltage controlled oscillator 1 is connected to the output of the loop filter 27, and the oscillation signal Sosc of the voltage controlled oscillator 1 is supplied to the N frequency divider 20 and an external circuit (not shown), as a result of which the normal PLL operation is performed. It should be noted that a value determined in the second mode is inputted as the operation current control signal Scont from the control section 24.

On the other hand, in the second mode, the switch circuit 26 is switched to allow the oscillation frequency control voltage Vcont outputted from the loop filter 27 to be inputted into the voltage measuring section 23, and the detection signal Svd corresponding to a voltage value measured by the voltage measuring section 23 is inputted into the control section 24 from the voltage measuring section 23.

It should be noted that the second mode is preferably performed in a condition as close as possible to the actual use state in order to decrease the difference between the first mode and the second mode.

Furthermore, in order to obtain a desired phase noise characteristic, the operation current Icc is automatically adjusted in the second mode before being used in the first mode.

Here, in a voltage controlled oscillator included in the PLL circuit as described above, and provided with an amplifier circuit which includes an inductor and a variable capacitance element and outputs an oscillation signal of an oscillation frequency corresponding to an oscillation frequency control voltage supplied to the variable capacitance element, and with a power supply circuit which supplies an operation current to the amplifier circuit, a relation between the operation current and the phase noise, and a relation between the operation current and the oscillation frequency control voltage are explained.

Figure 9:
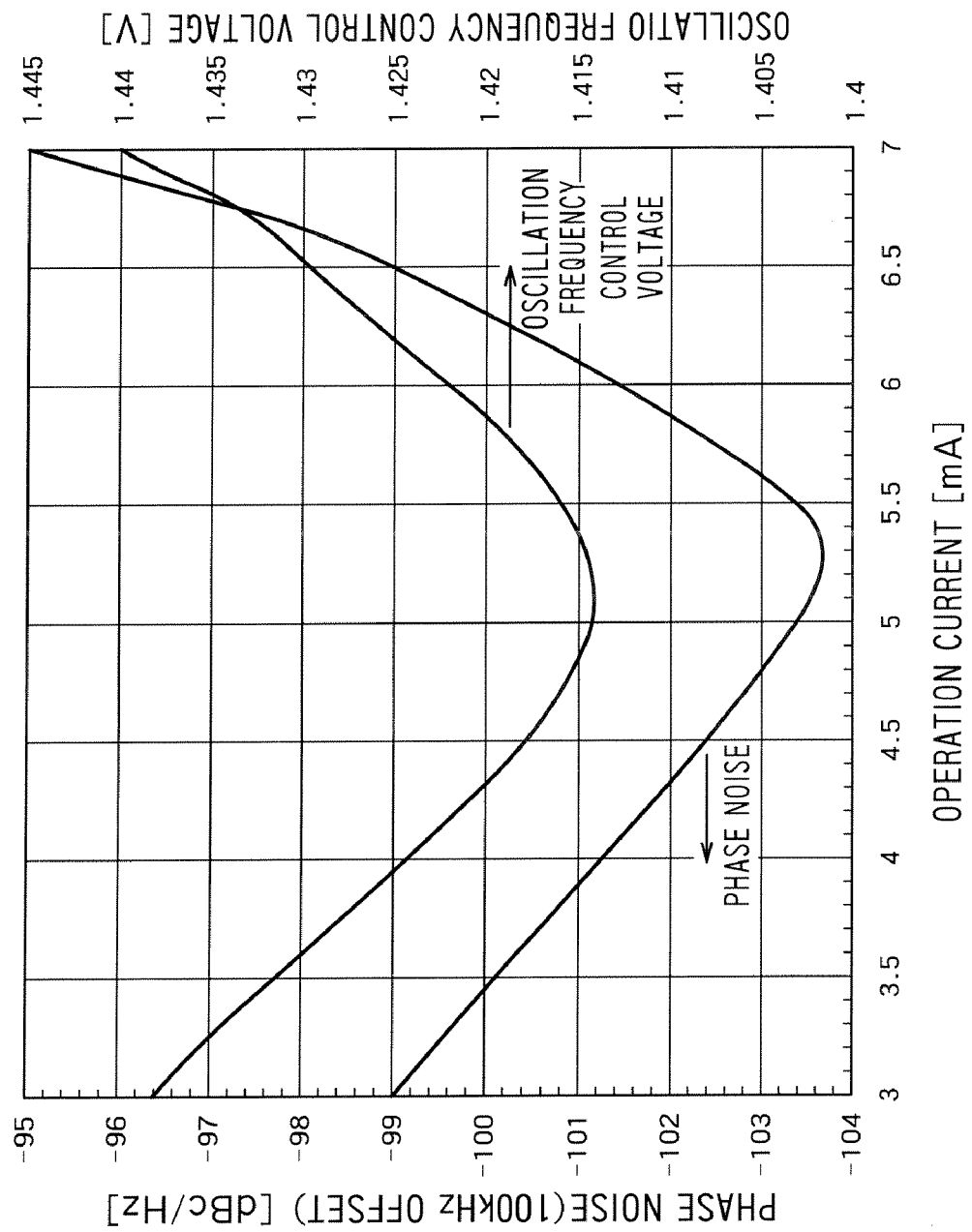
FIG. 9 is a graph showing a relation between the operation current of the voltage controlled oscillator and the phase noise, and a relation between the operation current and the oscillation frequency control voltage.

FIG. 9 is a graph showing a relation between the operation current of the voltage controlled oscillator and the phase noise, and a relation between the operation current and the oscillation frequency control voltage. It should be noted that the frequency of the oscillation signal Sosc in the PLL circuit 22 is fixed to 2400 MHz.

Here, in the state where the frequency is fixed, when the current supplied to the amplifier circuit 4 in the voltage controlled oscillator 1 is changed, the oscillation frequency control voltage Vcont is slightly changed. At this time, when the phase noise characteristic is observed simultaneously with the oscillation frequency control voltage Vcont, it is seen that there is a relation between the phase noise and the oscillation frequency control voltage in which the phase noise becomes minimum at a current value at which the oscillation frequency control voltage Vcont becomes minimum. That is, the phase noise characteristic is optimized at a current value at which the oscillation frequency control voltage Vcont becomes minimum.

As shown in FIG. 9, when the value of operation current is about 5.2 mA, the phase noise takes a minimum value of about=103 dBc/Hz. Thus, the phase noise characteristic is optimized at this value of operation current.

Accordingly, in the present example, instead of directly measuring the phase noise, the relation between the operation current of the voltage controlled oscillator and the phase noise is utilized, so that the change of the oscillation frequency control voltage Vcont due to the operation current is observed to thereby enable the phase noise characteristic to be automatically adjusted in the integrated circuit.

Next, an operation of the operation current adjusting device 200 having the above described configuration and functions, that is, a method for adjusting the operation current of the voltage controlled oscillator 1 is explained below with reference to flow charts. Here, the operation in the second mode in which the switch circuit 26 of the operation current adjusting device 200 is switched to allow the training to be performed, is explained in particular.

Figure 10:
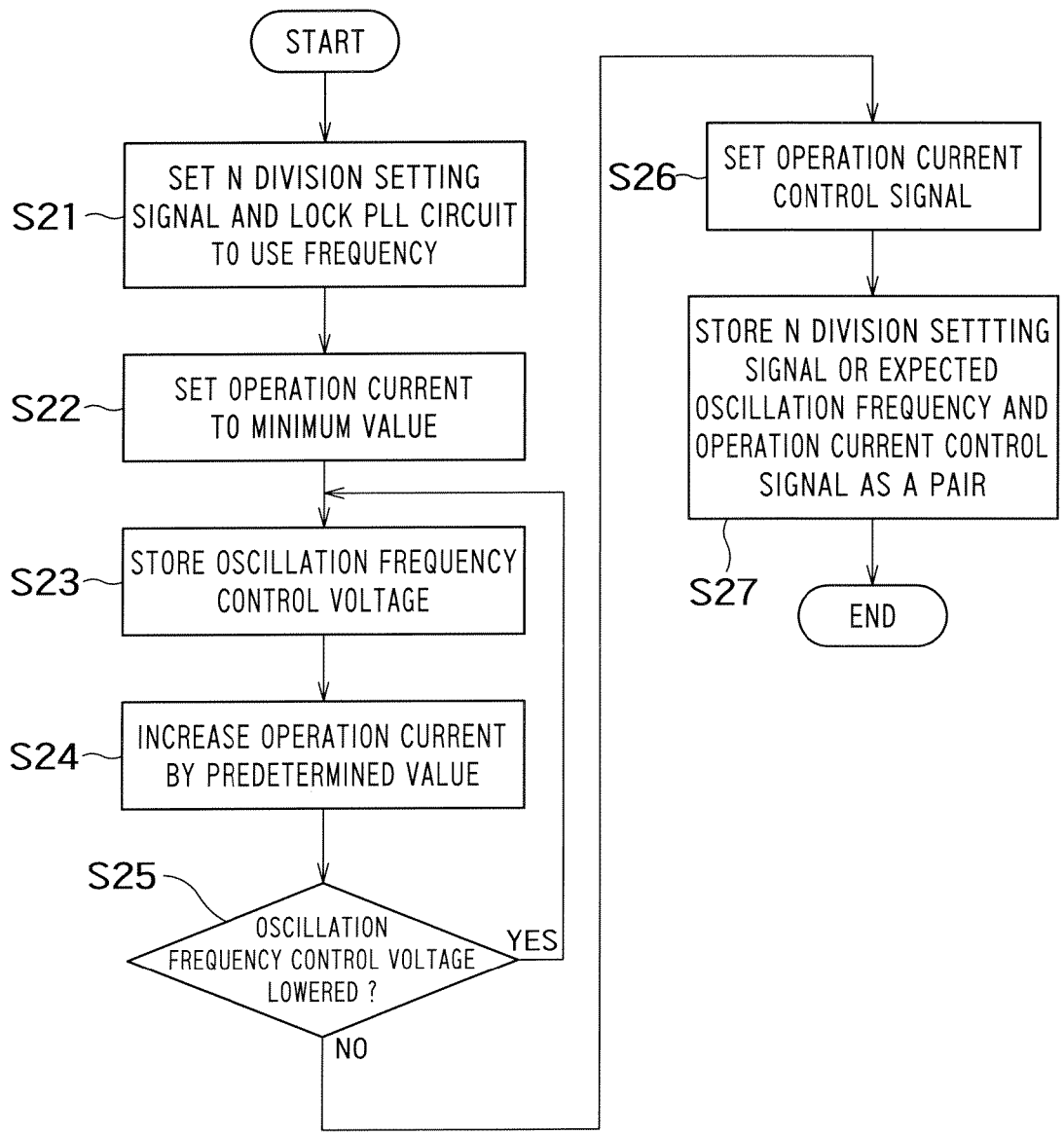
FIG. 10 is a flow chart showing an example of an operation for adjusting the oscillation signal of the voltage controlled oscillator of the operation current adjusting device according to the Embodiment 2 of the present invention.

FIG. 10 is a flow chart showing an example of an operation for adjusting the oscillation signal of the voltage controlled oscillator of the operation current adjusting device according to the Embodiment 2 of the present invention.

First, as shown in FIG. 10, the control section 24 outputs an N division setting signal Sdset to the N frequency divider 20, to lock the PLL circuit 22 to an oscillation frequency used in the first mode (step S21).

Next, the control section 24 outputs a desired operation current control signal Scont, to set the operation current Icc outputted from the power supply circuit 5 to a sufficiently small value (step S22). Here, the operation current Icc may be reduced to a lower limit current which enables the voltage controlled oscillator to continue the oscillation output.

Next, the control section 24 stores an oscillation frequency control voltage Vcont measured by the voltage measuring section 23 in the storage section 25 (step S23).

Next, the control section 24 changes the operation current control signal Scont so as to increase the operation current Icc outputted from the power supply circuit 5 by a predetermined value (step S24).

Next, at the operation current Icc in step S24, the control section 24 compares an oscillation frequency control voltage Vcont measured by the voltage measuring section 23 with the oscillation frequency control voltage Vcont stored in step S23. When the oscillation frequency control voltage Vcont measured by the voltage measuring section 23 is lowered below the oscillation frequency control voltage Vcont stored in step S23, the control section 24 returns to step S23 and stores the lowered oscillation frequency control voltage Vcont (step S25).

On the other hand, in step S25, when the oscillation frequency control voltage Vcont measured by the voltage measuring section 23 is increased above the oscillation frequency control voltage Vcont stored in step S23, the control section 24 judges that the oscillation frequency control voltage Vcont is in the vicinity of the minimum value, and proceeds to the following step.

Through the above described steps S21 to S25, the operation current outputted from the power supply circuit 5 is changed in the state where the oscillation frequency is fixed to a desired value.

Here, the operation current Icc in step S4 exceeds the current value at which the oscillation frequency control voltage Vcont becomes maximum, and hence, the operation current Icc reduced by the predetermined value is set as the operation current at which the phase noise characteristic is optimized (step S26). At this time, since a stable phase noise characteristic can be normally obtained on the side where the operation current Icc is smaller than the current optimum value, the operation current Icc may be reduced by a value larger than the predetermined value. Furthermore, depending upon the accuracy required of the voltage controlled oscillator 1, the operation current Icc outputted in step S24 may be set as the operation current at which the phase noise characteristic is optimized.

Next, the control section 24 stores the N division setting signal Sdset or an expected oscillation frequency and the operation current control signal Scont as a pair in the storage section 25 (step S27).

Through the above described steps S26 and S27, a value of operation current at which the oscillation frequency of the oscillation signal takes a value in the vicinity of the maximum value, is extracted, and this value of operation current is set as the value of operation current outputted from the amplifier circuit.

Through the above described flow, the operation for adjusting the operation current of the voltage controlled oscillator 1 of the operation current adjusting device 200 is completed.

It should be noted that in the case where a plurality of oscillation frequencies of the PLL circuit 22 are set, the control section 24 returns to step S21 and again performs the above described flow at a different oscillation frequency. In the first mode which is the normal operation mode, the control section 24 reads suitable values corresponding to the oscillation frequency from the N division setting signal Sdset or the oscillation frequency and the set operation current control signal Scont, which are stored in the storage section 25, and outputs the operation current control signal Scont to the voltage controlled oscillator 1, and the N division setting signal Sdset to the N frequency divider 20.

This enables the voltage controlled oscillator 1 to output an oscillation signal having a stable phase noise characteristic in the first mode which is the normal operation mode.

Here, in the above described flow chart, the operation current Icc which is in the vicinity of the minimum value of the oscillation frequency control voltage Vcont, is obtained by increasing the operation current Icc from a small value (minimum value), but the operation current Icc which is in the vicinity of the minimum value of the oscillation frequency control voltage Vcont may also be obtained by decreasing the operation current Icc from a large value (maximum value).

Figure 11:
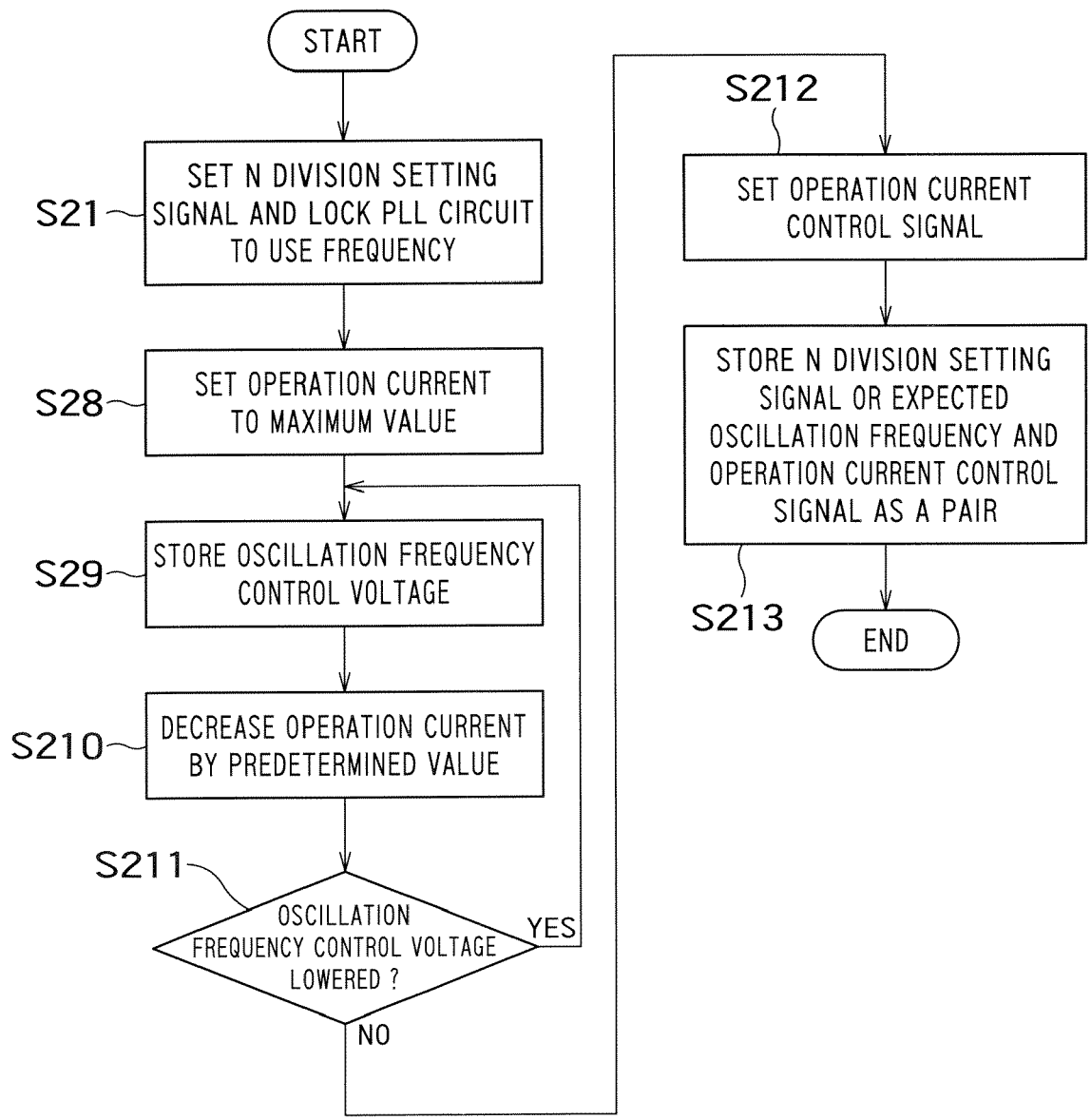
FIG. 11 is a flow chart showing another example of an operation for adjusting the oscillation signal of the voltage controlled oscillator of the operation current adjusting device according to the Embodiment 2 of the present invention.

FIG. 11 is a flow chart showing another example of an operation for adjusting the oscillation signal of the voltage controlled oscillator of the operation current adjusting device according to the Embodiment 2 of the present invention.

As shown in FIG. 11, first, the control section 24 outputs an N division setting signal Sdset to the N frequency divider 20, and locks the PLL circuit 22 to an oscillation frequency used in the first mode (Step S21).

Next, the control section 24 outputs a desired operation current control signal Scont, and sets the operation current Icc outputted from the power supply circuit 5 to a sufficiently large value (maximum value) (step S28). It should be noted that for example, in the case where an approximate value of the operation current Icc at which the oscillation frequency control voltage Vcont becomes minimum is recognized, the operation current Icc may be set to a value larger than this approximate value by a predetermined value or more.

Next, the control section 24 stores an oscillation frequency control voltage Vcont measured by the voltage measuring section 23 in the storage section 25 (step S29).

Next, the control section 24 decreases the operation current Icc outputted from the power supply circuit 5 by a predetermined amount by changing the operation current control signal Scont (step S210).

Next, at the operation current Icc in step S210, the control section 24 compares an oscillation frequency control voltage Vcont measured by the voltage measuring section 23 with the oscillation frequency control voltage Vcont stored in step S29. In the case where the oscillation frequency control voltage Vcont measured by the voltage measuring section 23 is lowered below the oscillation frequency control voltage Vcont stored in step S29, the control section 24 returns to step S29 and stores the lowered oscillation frequency control voltage Vcont (step 211).

On the other hand, in the case where in step S211, the oscillation frequency control voltage Vcont measured by the voltage measuring section 23 is increased above the oscillation frequency control voltage Vcont stored in step S29, the control section 24 judges that this oscillation frequency control voltage Vcont is in the vicinity of the minimum value, and proceeds to the following step.

Through the above described steps S21 to S211, the operation current outputted from the power supply circuit 5 is changed in the state where the oscillation frequency is fixed to a desired value.

Here, the operation current Icc in step S210 is smaller than the current value at which the oscillation frequency control voltage Vcont becomes minimum, and hence is increased by the predetermined value, so that the increased operation current Icc is set as the current at which the phase noise characteristic is optimized (step S12). At this time, since a stable phase noise characteristic can be obtained on the side where the operation current Icc is lower than the current optimum value, the operation current Icc outputted in step S211 may be set as the current at which the phase noise characteristic is optimized, without being increased by the predetermined amount.

Next, the control section 24 stores the set N division setting signal Sdset or an expected oscillation frequency and the operation current control signal Scont as a pair in the storage section 25 (step S213).

Through the above described steps S212 and S213, a value of operation current at which the oscillation frequency control voltage Vcont takes a value in the vicinity of the minimum value is extracted, and this value of operation current is set as the value of operation current outputted from the amplifier circuit.

Through the above described flow, the operation for adjusting the operation current of the voltage controlled oscillator 1 of operation current adjusting device 200 is completed.

It should be noted that in the case where a plurality of oscillation frequencies of the PLL circuit 22 are set, the control section 24 returns to step S21 and the above described flow is again performed at a different oscillation frequency. In the first mode which is the normal operation mode, the control section 24 reads suitable values corresponding to the oscillation frequency from the N division setting signal Sdset or the oscillation frequency and the set operation current control signal Scont, which are stored in the storage section 25, and outputs the operation current control signal Scont to the voltage controlled oscillator 1 and the N division setting signal Sdset to the N frequency divider 20.

Thereby, in the first mode which is the normal operation mode, the voltage controlled oscillator 1 is capable of outputting an oscillation signal having a stable phase noise characteristic.

Figure 12:
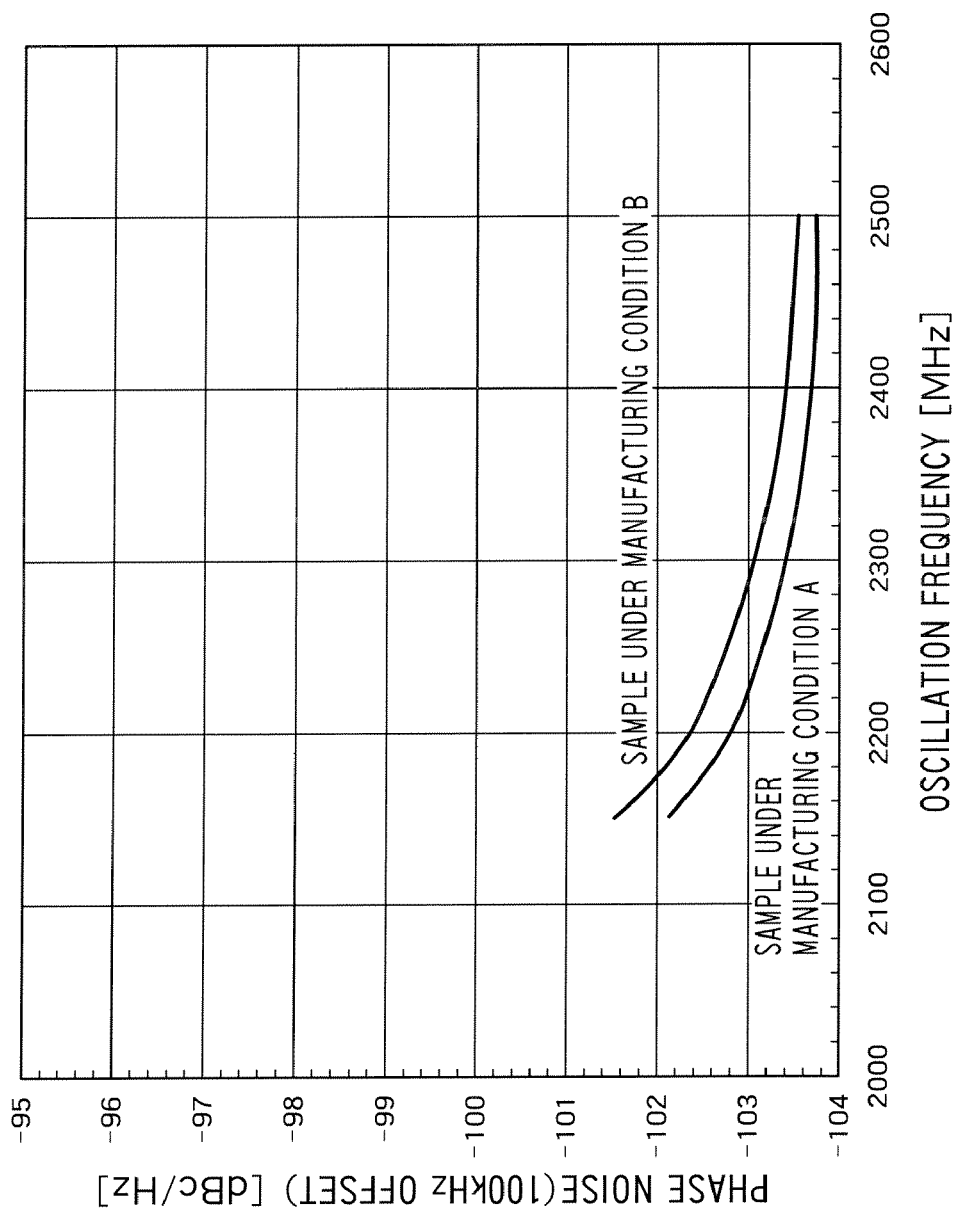
FIG. 12 shows relations between the oscillation frequency of the voltage controlled oscillator according to the Embodiment 2 and the phase noise.

Here, FIG. 12 shows relations between the oscillation frequency of the voltage controlled oscillator according to the Embodiment 2 and the phase noise. As shown in FIG. 12, it is seen that favorable phase noise characteristics can be obtained even under different manufacturing conditions.

It should be noted that besides the operation current adjusting methods of the operation current adjusting device shown in the flow charts in FIG. 10 and FIG. 11, a method in which the characteristic of the oscillation frequency is once measured with respect to the sweepable operation current Icc, and thereafter the operation current Icc which is in the vicinity of the minimum value of the oscillation frequency control voltage Vcont is obtained by calculation, and the like can be considered.

As described above, with the operation current adjusting device according to the present example, by changing the operation current outputted from the power supply circuit in the state where the oscillation frequency is fixed to a desired value, a value of operation current at which the oscillation frequency control voltage takes a value in the vicinity of the minimum value, is extracted to be set as the value of the operation current outputted from the amplifier circuit, as a result of which the phase noise characteristic of the voltage controlled oscillator can be automatically adjusted.

It should be noted that in the respective embodiments described above, the second mode can be more effectively performed by being repeatedly performed in a part or all of the use frequencies, after the power supply of the operation current adjusting device is turned on.

Furthermore, in the respective embodiments described above, the second mode can be more efficiently performed by being repeatedly performed in a part or all of the use frequencies, after the use frequencies are determined.

What is claimed is:

1. A voltage controlled oscillator comprising:
an amplifier circuit which includes an inductor and a variable capacitance element, and outputs an oscillation signal of an oscillation frequency corresponding to an oscillation frequency control voltage supplied to the variable capacitance element; and
a power supply circuit which supplies an operation current to the amplifier circuit,
wherein by changing the operation current outputted from the power supply circuit in a state where the oscillation frequency control voltage is fixed to a desired value, a value of the operation current at which the oscillation frequency of the oscillation signal takes a value in the vicinity of a maximum value, is extracted, and the extracted value of the operation current is set as a value of the operation current outputted from the power supply circuit.

2. The voltage controlled oscillator according to claim 1, wherein the operation current is changed to increase from a minimum value.

3. The voltage controlled oscillator according to claim 1, wherein the operation current is changed to decrease from a maximum value.

4. An operation current adjusting device comprising:
a voltage controlled oscillator which has an amplifier circuit including an inductor and a variable capacitance element, and outputting an oscillation signal of a frequency corresponding to an oscillation frequency control voltage supplied to the variable capacitance element, and has a power supply circuit supplying an operation current to the amplifier circuit;
a voltage generating section which outputs the oscillation frequency control voltage;
a frequency detecting section which measures the oscillation frequency of the oscillation signal; and
a control section which outputs a voltage setting signal for the voltage generating section to control the oscillation frequency control voltage, and outputs an operation current control signal for the power supply circuit to control the operation current on the basis of the oscillation frequency measured by the frequency detecting section,
wherein the control section outputs the voltage setting signal to the voltage generating section to fix the oscillation frequency control voltage to a desired value, changes the operation current outputted from the power supply circuit by the operation current control signal, extracts a value of the operation current at which the oscillation frequency of the oscillation signal measured by the frequency detecting section takes a value in the vicinity of a maximum value, and outputs the operation current control signal to set the operation current outputted from the power supply circuit to the extracted value of the operation current.

5. The operation current adjusting device according to claim 4, further comprising a storage section which stores the extracted operation current.

6. The operation current adjusting device according to claim 4, wherein the control section changes the operation current to increase the operation current from a minimum value.

7. The operation current adjusting device according to claim 4, wherein the control section changes the operation current to decrease the operation current from a maximum value.

8. An operation current adjusting device comprising:
a PLL circuit provided with a voltage controlled oscillator which includes an amplifier circuit having an inductor and a variable capacitance element, and outputting an oscillation signal of a frequency corresponding to an oscillation frequency control voltage supplied to the variable capacitance element, and includes a power supply circuit supplying an operation current to the amplifier circuit, with an N frequency divider which outputs a signal formed by dividing the oscillation signal to 1/N, with a phase comparator which compares an oscillation frequency of the output signal of the N frequency divider with a reference frequency and generates a phase difference signal, and with a loop filter which outputs the oscillation frequency control voltage on the basis of the phase difference signal outputted by the phase comparator;
a voltage measuring section which measures the oscillation frequency control voltage; and
a control section which outputs an N division setting signal for controlling the N frequency divider, and outputs an operation current control signal for the power supply circuit to control the operation current on the basis of the oscillation frequency control voltage measured by the voltage measuring section,
wherein the control section outputs the N division setting signal to the N frequency divider to fix the oscillation frequency to a desired value, and changes the operation current outputted from the power supply circuit by the operation current control signal, whereby the control section extracts a value of the operation current at which a value of the oscillation frequency control voltage measured by the voltage measuring section becomes a value in the vicinity of a minimum value in the case of the voltage controlled oscillator whose oscillation frequency-oscillation frequency control voltage characteristic has a positive inclination, or extracts a value of the operation current at which a value of the oscillation frequency control voltage measured by the voltage measuring section becomes a value in the vicinity of a maximum value in the case of the voltage controlled oscillator whose oscillation frequency-oscillation frequency control voltage characteristic has a negative inclination, and outputs the operation current control signal to set the operation current outputted from the power supply circuit to the extracted value of the operation current.

9. The operation current adjusting device according to claim 8, further comprising a storage section which stores the extracted operation current.

10. The operation current adjusting device according to claim 8, wherein the control section changes the operation current to increase the operation current from a minimum value.

11. The operation current adjusting device according to claim 8, wherein the control section changes the operation current to decrease the operation current from a maximum value.

12. An operation current adjusting method of a voltage controlled oscillator having an amplifier circuit which includes an inductor and a variable capacitance element and outputs an oscillation signal of an oscillation frequency corresponding to an oscillation frequency control voltage supplied to the variable capacitance element, and having a power supply circuit which supplies an operation current to the amplifier circuit, comprising:
changing the operation current outputted from the power supply circuit in a state where the oscillation frequency control voltage is fixed to a desired value;
extracting a value of the operation current at which the oscillation frequency of the oscillation signal takes a value in the vicinity of a maximum value; and
setting the value of the operation current outputted from the amplifier circuit to the extracted value of the operation current.

13. The operation current adjusting method of the voltage controlled oscillator according to claim 12, wherein the operation current is changed to increase from a minimum value.

14. The operation current adjusting method of the voltage controlled oscillator according to claim 12, wherein the operation current is changed to decrease from a maximum value.

* * * * *